(12) United States Patent
Pendse (10) Patent No.: US 10,700,041 B2
(45) Date of Patent: Jun. 30, 2020

(54) STACKING OF THREE-DIMENSIONAL CIRCUITS INCLUDING THROUGH-SILICON-VIAS

(71) Applicant: Facebook Technologies, LLC, Menlo Park, CA (US)

(72) Inventor: Rajendra D. Pendse, Fremont, CA (US)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/222,460

(22) Filed: Dec. 17, 2018

(65) Prior Publication Data

US 2020/0098729 A1    Mar. 26, 2020

Related U.S. Application Data

(60) Provisional application No. 62/734,700, filed on Sep. 21, 2018.

(51) Int. Cl.
*H01L 25/065* (2006.01)
*H01L 25/00* (2006.01)
(Continued)

(52) U.S. Cl.
CPC .... *H01L 25/0657* (2013.01); *H01L 21/76898* (2013.01); *H01L 23/481* (2013.01);
(Continued)

(58) Field of Classification Search
None
See application file for complete search history.

(56) References Cited

U.S. PATENT DOCUMENTS 8,560,982 B2 * 10/2013 Rahman ............. H01L 25/0655
257/773
9,099,632 B2 * 8/2015 Chern ..................... H01L 24/97
(Continued)

FOREIGN PATENT DOCUMENTS

KR    10-2016/0025280 A    3/2016

OTHER PUBLICATIONS

PCT International Search Report and Written Opinion, PCT Patent Application No. PCT/US2018/066414, dated Jun. 14, 2019, 10 pages.

*Primary Examiner* — Telly D Green
(74) *Attorney, Agent, or Firm* — Fenwick & West LLP (57) ABSTRACT

An assembly of circuit dies is stacked through oxide-oxide bonding. The assembly includes a silicon substrate, in which a plurality of through-silicon-vias are formed. The silicon substrate is attached onto a die through dielectric-dielectric bonding with at least part of the through-silicon-vias electrically connected to the die. The silicon substrate and die are attached onto another die through oxide-oxide bonding. Then the through-silicon-vias are revealed. The silicon substrate functions as a carrier substrate before the revealing. The silicon substrate and two dies can be attached to a printed circuit board, which is electrically connected to the two dies. One or more electrical components can be attached onto the silicon substrate and electrically connected to the die through the through-silicon-vias. The silicon substrate may include a metal element for diffusing heat generated from operation of the one or more electrical components.

10 Claims, 7 Drawing Sheets

(51) Int. Cl.
 *H01L 23/00* (2006.01)
 *H01L 23/48* (2006.01)
 *H01L 21/768* (2006.01)
 *H01L 25/18* (2006.01)

(52) U.S. Cl.
 CPC ............ *H01L 24/08* (2013.01); *H01L 24/80*
  (2013.01); *H01L 25/18* (2013.01); *H01L 25/50*
  (2013.01); *H01L 2224/08146* (2013.01); *H01L*
  *2224/80896* (2013.01); *H01L 2225/06524*
  (2013.01); *H01L 2225/06541* (2013.01); *H01L*
  *2225/06589* (2013.01); *H01L 2924/12041*
  (2013.01); *H01L 2924/12043* (2013.01); *H01L*
  *2924/14253* (2013.01)

(56) References Cited

U.S. PATENT DOCUMENTS

| | | | | |
|---|---|---|---|---|
| 9,236,341 | B1* | 1/2016 | Kim | H01L 23/5226 |
| 9,704,830 | B1* | 7/2017 | Ayotte | H01L 21/78 |
| 9,720,013 | B2* | 8/2017 | Huang | G01R 1/0408 |
| 9,806,128 | B2* | 10/2017 | Tan | H01L 27/2436 |
| 10,332,923 | B2* | 6/2019 | Josberger | B29D 11/00326 |
| 2010/0246152 | A1* | 9/2010 | Lin | H01L 21/563 |
| | | | | 361/783 |
| 2012/0228650 | A1* | 9/2012 | Chern | H01L 24/97 |
| | | | | 257/88 |
| 2012/0331435 | A1* | 12/2012 | Rahman | H01L 25/0655 |
| | | | | 716/120 |
| 2013/0127048 | A1 | 5/2013 | Hasegawa et al. | |
| 2013/0252416 | A1* | 9/2013 | Takeda | H01L 25/0657 |
| | | | | 438/630 |
| 2014/0118019 | A1* | 5/2014 | Huang | G01R 1/0408 |
| | | | | 324/759.01 |
| 2014/0329381 | A1 | 11/2014 | Zhang et al. | |
| 2015/0171024 | A1 | 6/2015 | Choi et al. | |
| 2016/0343719 | A1* | 11/2016 | Liu | H01L 27/11206 |
| 2016/0343773 | A1* | 11/2016 | Tan | H01L 27/2436 |
| 2017/0005073 | A1 | 1/2017 | Lin et al. | |
| 2017/0186728 | A1* | 6/2017 | Chainer | H01L 25/0657 |
| 2017/0200699 | A1* | 7/2017 | Ayotte | H01L 21/78 |
| 2018/0102311 | A1* | 4/2018 | Shih | H01L 23/5383 |
| 2018/0239304 | A1* | 8/2018 | Josberger | H01L 27/14643 |
| 2019/0019764 | A1* | 1/2019 | Nair | H01L 25/0657 |
| 2019/0355640 | A1* | 11/2019 | Yu | H01L 25/00 |

* cited by examiner

STACKING OF THREE-DIMENSIONAL CIRCUITS INCLUDING THROUGH-SILICON-VIAS

CROSS-REFERENCE TO RELATED APPLICATION

This application claims the benefit of U.S. Provisional Patent Application No. 62/734,700, filed Sep. 21, 2018, the disclosure of which is hereby incorporated by reference in its entirety.

BACKGROUND

Field of the Disclosure

The present disclosure generally relates to stacking of three-dimensional (3D) circuits, and specifically to stacking circuit dies that includes through-silicon-vias formed in a passive layer.

Description of the Related Arts

A 3D integrated circuit may include multiple circuit dies that are stacked together and interconnected by using through-silicon-vias. A 3D integrated circuit can achieve performance improvements at reduced power and smaller footprint than conventional two dimensional processes. However, currently existing methods for stacking 3D circuit dies have limits in face-to-back configuration. For example, they fail to integrate high density functional modules on functional circuits. They also cannot provide a large number of through-silicon-vias interconnects without loss of active circuit area. Additionally, the currently existing methods use temporary carriers and have challenges in surface bonding between the temporary carriers and dies. These fallbacks in the currently existing methods prohibit integrating high density electronic components in 3D circuit dies.

SUMMARY

Embodiments relate to fabricating an assembly of stacked circuit dies. A plurality of through-silicon-vias are formed in a silicon substrate. The silicon substrate may function as a permanent carrier for stacking circuit dies. The silicon substrate is attached onto a first die through dielectric-to-dielectric bonding. Part or all of the through-silicon-vias are electrically connected to the first die. The silicon substrate and the first die are attached onto a second die through face-to-face bonding. The first die is electrically connected to the second die. The silicon substrate can be thinned to reveal the through-silicon-vias. The through-silicon-vias provides electrical connection between electrical components attached on the silicon substrate and the first die.

In some embodiments, an array of micro light emitting diodes (LEDs) are attached onto the silicon substrate after the through-silicon-vias are revealed. The micro LEDs are electrically connected to the first die through the through-silicon-vias. The first dies may include a driving circuit that provides electrical current to drive the micro LEDs. The second die may include a digital circuit that converts digital signals to analog signals for operating the micro LEDs. Also, the silicon substrate may include a metal element that dissipate heat generated from operation of the micro LEDs.

Embodiments according to the invention are in particular disclosed in the attached claims directed to a method and an assembly of stacked circuit dies, wherein any feature mentioned in one claim category, e.g. method, can be claimed in another claim category, e.g. assembly, system, storage medium, and computer program product, as well. The dependencies or references back in the attached claims are chosen for formal reasons only. However any subject matter resulting from a deliberate reference back to any previous claims (in particular multiple dependencies) can be claimed as well, so that any combination of claims and the features thereof is disclosed and can be claimed regardless of the dependencies chosen in the attached claims. The subject-matter which can be claimed comprises not only the combinations of features as set out in the attached claims but also any other combination of features in the claims, wherein each feature mentioned in the claims can be combined with any other feature or combination of other features in the claims. Furthermore, any of the embodiments and features described or depicted herein can be claimed in a separate claim and/or in any combination with any embodiment or feature described or depicted herein or with any of the features of the attached claims.

In an embodiment, a method for fabricating an assembly of stacked circuit dies, may comprise:
forming a plurality of through-silicon-vias in a silicon substrate;
attaching the silicon substrate onto a first die with at least part of the through-silicon-vias electrically connected to the first die;
attaching the silicon substrate and the first die onto a second die through face-to-face bonding with the first die electrically connected to the second die; and
revealing the through-silicon-vias after the second die is attached onto the first die and the silicon substrate,
wherein the silicon substrate is configured to function as a carrier substrate before the revealing.

A number of the through-silicon-vias may be in a range from 10,000 to 500,000.

The through-silicon-vias may have a pitch in a range from 1 to 50 micrometers.

In an embodiment, a method may comprise:
attaching the silicon substrate attached with the first and second dies, on a printed circuit board with the second die electrically connected to the printed circuit board.

In an embodiment, a method may comprise:
attaching one or more electrical components onto the silicon substrate after the through-silicon-vias are revealed with the electrical components electrically connected to the first die through the through-silicon-vias.

The one or more electrical components may include an array of micro light emitting diodes or photodiodes.

The first die may comprise a driving circuit configured to provide driving current to the one or more electrical components.

The second die may comprise a digital circuit configured to convert digital signals into analog signals for operating the one or more electrical components.

The silicon substrate may comprise a metal element configured to diffuse heat generated from operation of the electrical components.

The through-silicon-vias may be formed at an edge of the silicon substrate.

In an embodiment, an assembly of stacked circuit dies may comprise:
a silicon substrate formed with through-silicon-vias;
a first die attached to the silicon substrate by bonding with electrodes of the first die electrically connected to the through-silicon-vias; and a second die attached to the first die by face-to-face bonding with electrodes of the second die electrically connected to the electrodes of the first die, wherein the silicon substrate is configured to function as a carrier substrate before the revealing.

A number of the through-silicon-vias may be in a range from 10,000 to 500,000.

The through-silicon-vias may have a pitch in a range from 1 to 50 micrometers.

In an embodiment, an assembly may comprise a printed circuit board on which the silicon substrate attached with the first and second dies is attached, the second die may be electrically connected to the printed circuit board.

In an embodiment, an assembly may comprise one or more electrical components attached onto the silicon substrate after the through-silicon-vias are revealed, the electrical components may be electrically connected to the first die through the through-silicon-vias.

The one or more electrical components may include an array of micro light emitting diodes or photodiodes.

The first die may comprise a driving circuit configured to provide driving current to the one or more electrical components.

The second die may comprise a digital circuit configured to convert digital signals into analog signals for operating the one or more electrical components.

The silicon substrate may comprise a metal element configured to diffuse heat generated from operation of the electrical components.

The through-silicon-vias may be formed at an edge of the silicon substrate.

In an embodiment according to the invention, one or more computer-readable non-transitory storage media may embody software that is operable when executed to perform, in particular within a manufacturing or assembly process or system, a method according to the invention or any of the above mentioned embodiments.

In an embodiment according to the invention, a system may comprise: one or more processors; and at least one memory coupled to the processors and comprising instructions executable by the processors, the processors operable when executing the instructions to perform, in particular within a manufacturing or assembly process or system, a method according to the invention or any of the above mentioned embodiments.

In an embodiment according to the invention, a computer program product, preferably comprising a computer-readable non-transitory storage media, may be operable when executed on a data processing system to perform, in particular within a manufacturing or assembly process or system, a method according to the invention or any of the above mentioned embodiments.

BRIEF DESCRIPTION OF THE DRAWINGS

The teachings of the embodiments can be readily understood by considering the following detailed description in conjunction with the accompanying drawings.

The figures depict various embodiments for purposes of illustration only.

DETAILED DESCRIPTION

In the following description of embodiments, numerous specific details are set forth in order to provide more thorough understanding. However, note that the embodiments may be practiced without one or more of these specific details. In other instances, well-known features have not been described in detail to avoid unnecessarily complicating the description.

Embodiments are described herein with reference to the figures where like reference numbers indicate identical or functionally similar elements. Also in the figures, the left most digits of each reference number corresponds to the figure in which the reference number is first used.

Embodiments relate to fabricating an assembly of stacked circuit dies by using a permanent carrier. The assembly includes a silicon substrate that functions as the permanent carrier, a first die, and a second die. The silicon substrate is attached onto the first die through dielectric-dielectric bonding. The second die is attached onto the first die and the silicon substrate through dielectric-dielectric bonding as well. Through-silicon-vias are formed in the silicon substrate and are revealed by thinning the silicon substrate. A number of electrical components are attached onto the silicon substrate and electrically connected to the first die through the through-silicon-vias. The silicon substrate includes metal elements for electrical routing and/or dissipating heat generated by operation of the electrical components. The assembly can be attached on a printed circuit board with the second die electrically connected to the printed circuit board.

Figure 1A:
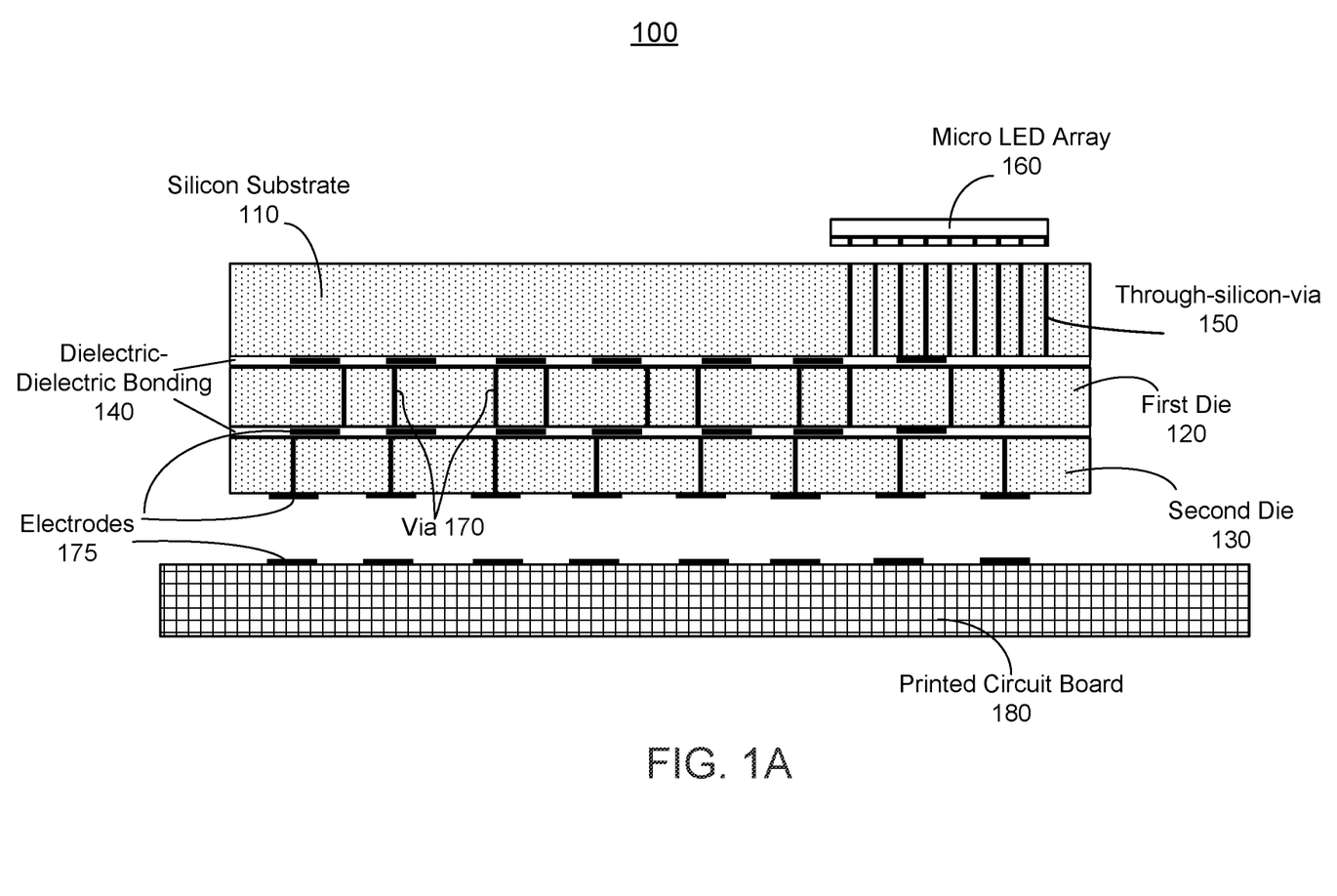
FIG. 1A is an example schematic view of an assembly of stacked circuit dies, in which a silicon substrate functions as a carrier, in accordance with an embodiment.

FIG. 1A is an example schematic view of an assembly 100 of stacked circuit dies, in accordance with an embodiment. The assembly 100 may include, among other components, a silicon substrate 110, a first die 120, and a second die 130. The silicon substrate 110, first die 120, and second die 130 are stacked together through dielectric-dielectric bonding 140. In one embodiment, the dielectric-dielectric bonding 140 is oxide-oxide bonding formed by having a top surface of oxide coming in contact with a bottom surface of oxide. By using the oxide-oxide bonding, the assembly 100 can withstand high temperature. The dielectric-dielectric bonding 140 can be silicon carbide bonding or other types of bonding. The silicon substrate 110 has a thickness in a range from 5 µm to 10 µm. In one embodiment, the silicon substrate 110 is about 5 µm thick, 3 mm wide, and 6 mm long, the first die 120 and the second die each are about 50 µm thick, 3 mm wide, and 6 mm long. In other embodiments, the silicon substrate 110, first die 120, and second die 130 can have different sizes.

The silicon substrate 110 includes through-silicon-vias 150. In some embodiments The through-silicon-vias 150 can be formed either before or after the silicon substrate 110 is assembled with the first die 120 and the second die 130. The through-silicon-vias 150 are revealed by thinning the silicon substrate 110 to get a planar surface with exposed pads of the through-silicon-vias 150. The planar surface facilitates fine pitch attachment of high density electronic components, such as sensors, photodiodes, micro LEDs. In some embodiments, the through-silicon-vias has a pitch in a range from 1 µm to 50 µm. The silicon substrate 110 can include a large number of the through-silicon-vias 150. The number of the through-silicon-vias 150 can be in a range from 10,000 to 500,000. In the embodiment of FIG. 1, the through-silicon-vias 150 are located at an edge of the silicon substrate 110. There is a clearance of approximately 0.25 millimeter between the through-silicon-vias 150 and the edge of the silicon substrate 110. In other embodiments, the through-silicon-vias 150 can be located in other regions of the silicon substrate 110.

In the embodiment of FIG. 1A, a micro LED array 160 is attached on the silicon substrate 110 and is electrically connected to the through-silicon-vias 150. In other embodiments, through-silicon-vias 150 may be connected to different devices (e.g., multiple micro LEDs). The micro LED array 110 includes a number of micro LEDs. These micro LEDs can be used in a display element in head-mounted devices, phones, or other types of electronic devices to embody one or more pixels.

At least some of the through-silicon-vias 150 are electrically connected to the first die 120. The first die 120 is electrically connected to the second die 130, for example, through vias 170 in the first die 120 and electrodes 175. In one embodiment, the first die 120 includes approximately 5,000 vias having a pitch of approximately 75 μm. Thus, with the through-silicon-vias 150, the micro LED array 160 is electrically connected to the first die 120 and the second die 130.

In the embodiment of FIG. 1A, the assembly 100 is attached on a printed circuit board 180 with the second die 130 electrically (and/or digitally) connected to the printed circuit board 180 through vias 170 in the second die 130 and electrodes 175. There can be approximately 500 vias 170 in the second die, which have a pitch of at least 125 μm. In some embodiments, the printed circuit board 180 includes circuitry that provides digital signals to the second die 130. The second die 130 may include circuitry that converts the digital signals received from the printed circuit board 180 into analog signals for operating the micro LED array 160. The first die 120 receives the analog signals generated by the second die 130 and provides driving current to the micro LED array 160 based on the analog signals. In one embodiment, the first die 120 includes a driving circuit that drives each micro LED in the micro LED array 160 separately so that each micro LED can have different brightness and/or color.

In the embodiment of FIG. 1A, the through-silicon-vias 150 are formed in the silicon substrate 110 (which can be a passive layer and does not include active circuit component) rather than the first die 120 or the second die 130 (which can be active circuit areas where circuit components are formed). Thus, this embodiment obviates the need to form a large number of high density through-silicon-vias in active circuit areas and therefore, loss of active circuit area is avoided. Also, the silicon substrate 110 functions as a permanent carrier, which obviates the need to use a temporary carrier. The permanent carrier does not need to be removed after the assembly is formed. Also, the process of attaching the first die 120 onto the silicon substrate 110 is easier than attaching the first die 120 onto a temporary carrier, which has high requirement on flatness of bonding surfaces.

Figure 1B:
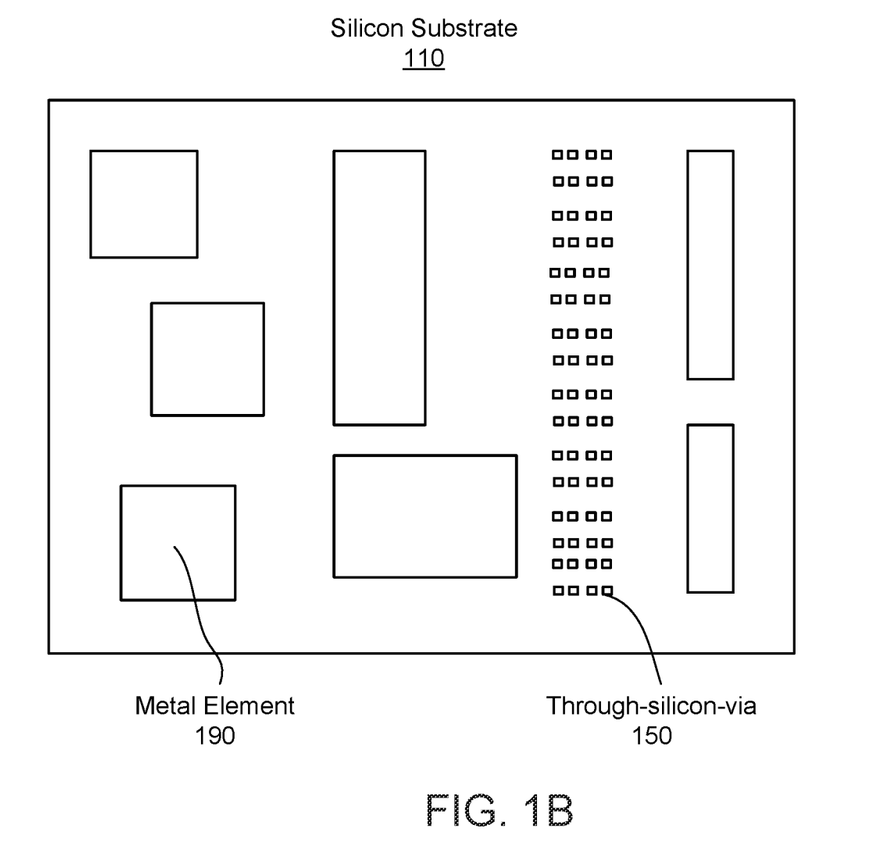
FIG. 1B is a cross-section illustrating the silicon substrate, in accordance with an embodiment.

FIG. 1B is a cross-section illustrating the silicon substrate 110, in accordance with an embodiment. In addition to the through-silicon-vias 150, a plurality of metal elements 190 are arranged in the silicon substrate 110. A metal element 190 can be a piece of copper, gold, or other types of metal that is embedded in the silicon substrate 110. FIG. 1B shows seven metal elements 190 having rectangular shapes. In other embodiments, the silicon substrate 110 can include a different number of metal elements 190 having various shapes. Also, up to 90% of the area of the cross section can be taken by the metal elements 190. The metal elements 190 can dissipate heat generated from operation of the micro LED array 160 and/or other electrical components. The metal elements 190 can also be embedded into the silicon substrate 110 for electrical routing. In some embodiments, the metal elements 190 is a dummy fill and is not electrically connected to the through-silicon-vias 150.

Figure 2A:
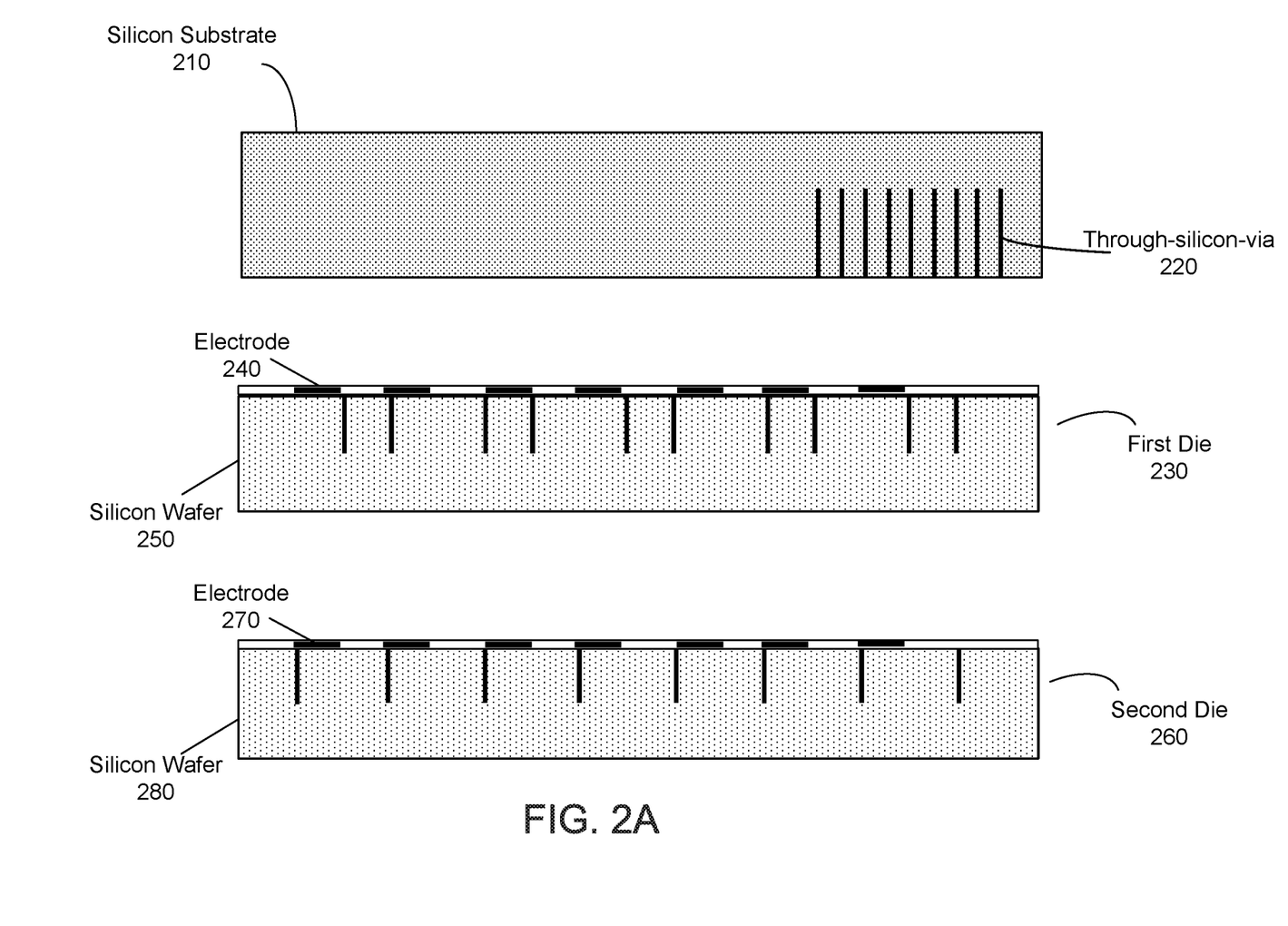
FIGS. 2A-2D illustrate a process of forming of an assembly of stacked circuit dies, in which a silicon substrate functions as a carrier, in accordance with an embodiment.

FIGS. 2A-2D illustrate a process of forming an assembly of stacked circuit dies by using a permanent carrier, in accordance with an embodiment. FIG. 2A shows a silicon substrate 210 where a number of through-silicon-vias 220 are formed. The silicon substrate 210 has a thickness that is larger than the height of the through-silicon-vias 220 so that the through-silicon-vias 220 are not revealed. In one embodiment, the height of the through-silicon-vias 220 is in a range from 5 μm to 10 μm. The through-silicon-vias 150 form high density electrical interconnects. The silicon substrate 210 can function as a carrier substrate that can be used to as a mechanical base to stack multiple integrated circuits together in a package. In addition to the through-silicon-vias 220, a metal element (not shown in FIG. 2A) is embedded in the silicon substrate to facilitate heat dissipation. FIG. 2A also shows a first die 230 with electrodes 240. The first die 230 includes a silicon wafer 250. FIG. 2A further shows a second die 260 with electrodes 270. The second die includes a silicon wafer 280.

Figure 2B:
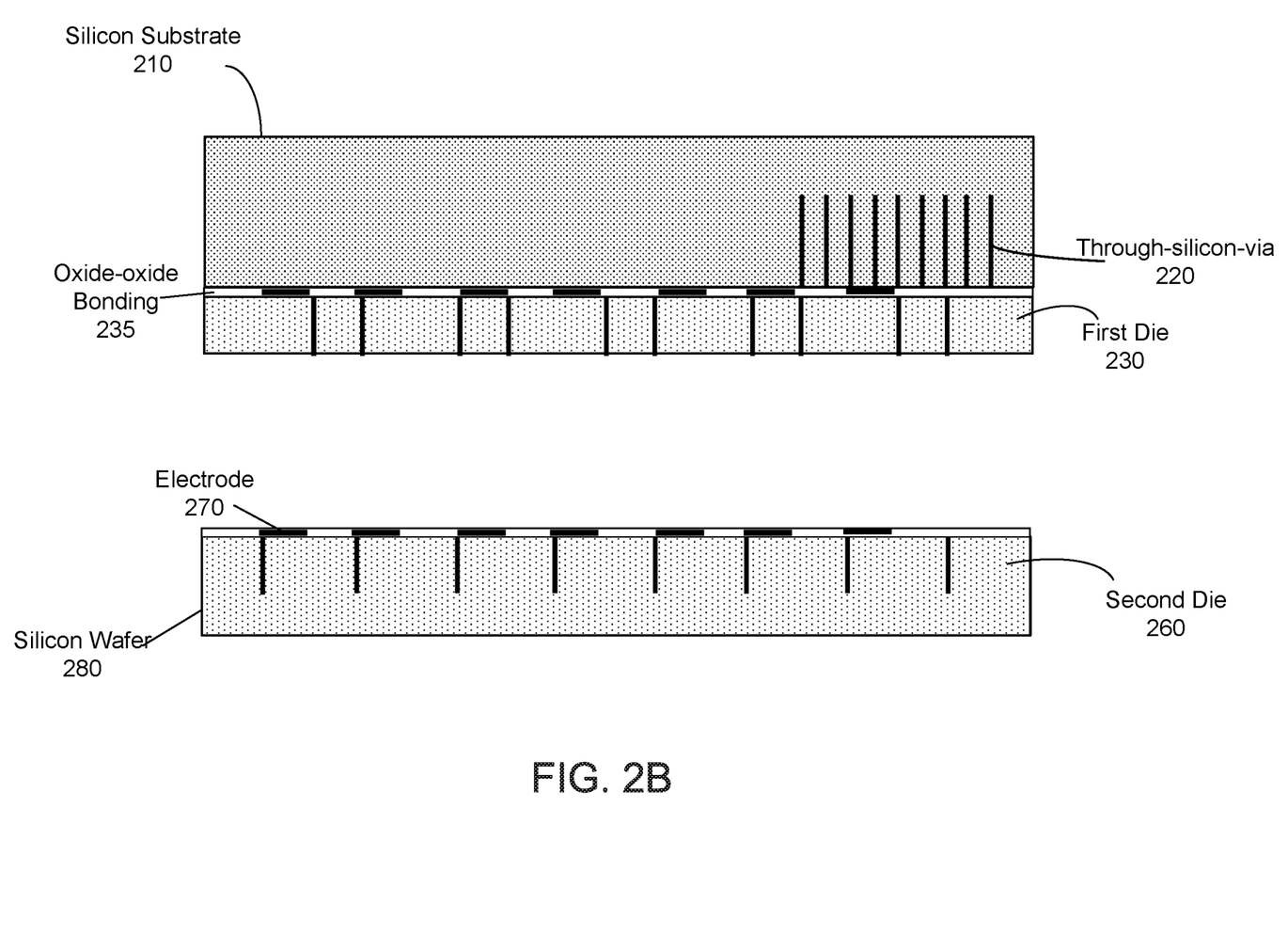

In FIG. 2B, the silicon substrate 210 is attached onto the first die 230 with at least part of the through-silicon-vias 220 electrically connected to the electrodes 240 of the first die 230. The silicon wafer 250 of the first die 230 is grinded off to reveal vias in the first die 230. A layer of oxide-oxide bonding 235 is formed between the silicon substrate 210 and the first die 230, for example, by performing surface treatment on the surfaces of the silicon substrate 210 and the first die 230 (e.g., by chemical-mechanical planarization or plasma treatment), abutting the treated surfaces of the silicon substrate 210 and the first die 230 to form Van der Waals bonding between the treated surfaces, and then annealing the surfaces at a temperature in a range from 200° C. to 250° C. The oxide-oxide bonding 235 avoids the usage of adhesive polymer that cannot withstand high temperate. Alternative to the oxide-oxide bonding 235, a layer of dielectric-dielectric bonding can be formed between the silicon substrate 210 and the first die 230.

Figure 2C:
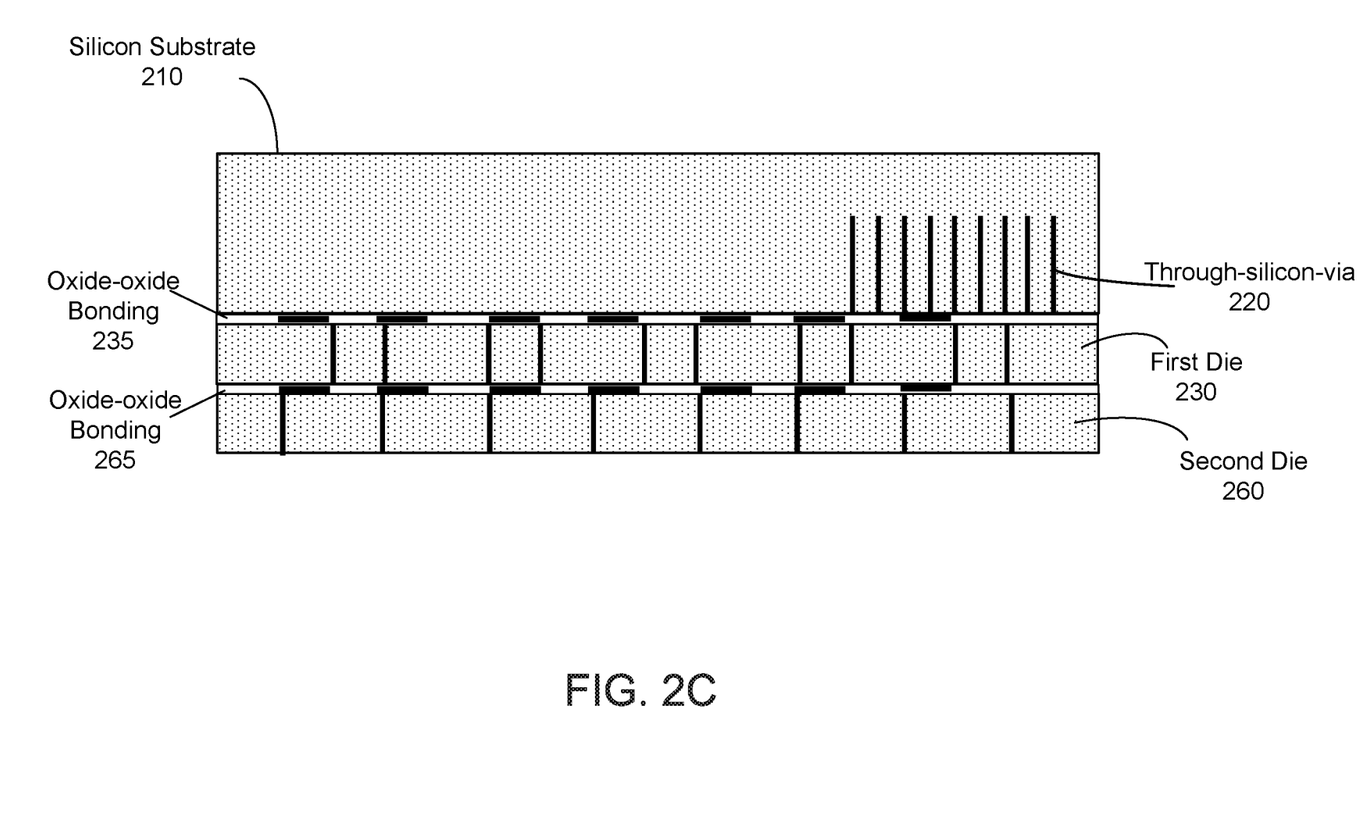

In FIG. 2C, the silicon substrate 210 and the first die 230 are attached onto the second die 260. The bonding between the first die 230 and second die 260 is face-to-face bonding. Because the silicon substrate 210 functions as a carrier substrate, the first die 230 and second die 260 do not have to be thin to facilitate the face-to-face bonding. The silicon wafer 280 of the second die 260 is grinded off to reveal vials in the second die 260. There is a layer of oxide-oxide bonding between the first die 230 and the second die 260. The oxide-oxide bonding may be obtained, for example, using the same process as described above with the silicon substrate 210 and the first die 230. Also, the first die 230 are electrically connected to the second die 260. Alternative to the oxide-oxide bonding 265, a layer of dielectric-dielectric bonding can be formed between the first die 230 and second die 260.

Figure 2D:
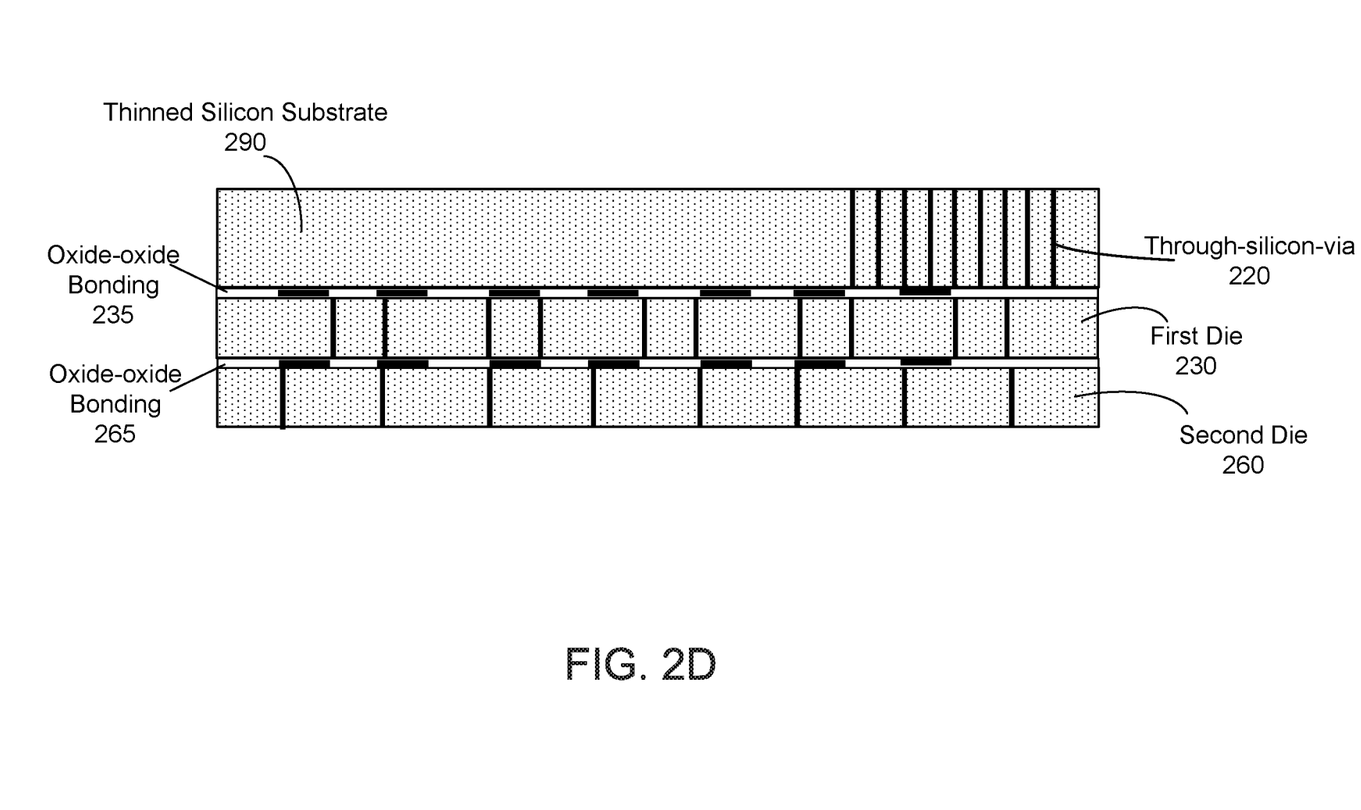

In FIG. 2D, the silicon substrate 210 is thinned to reveal the through-silicon-vias 220. In one embodiment, the silicon substrate 210 is thinned by dry etching or wet etching. In another embodiment, the silicon substrate 210 is thinned by mechanical polish, chemical polish, or a combination of both. The thickness of the silicon substrate 210 is reduced to be equal to or less than the height of the through-silicon-vias 220. As a result, the through-silicon-vias 220 pass through the silicon substrate 210 to establish an electrical connection from a side of the silicon substrate 210 facing the first die 230 to a an opposite side of the silicon substrate 210. Also, because the through-silicon-vias 220 are formed in the silicon substrate (which is a passive layer), loss of active circuit areas in the first die 230 and second die 260 is avoided or reduced. In the embodiment of FIGS. 2A-2D, the through-silicon-vias 220 are formed in the silicon substrate 210 before the silicon substrate 210 are attached to the first die 230 and second die 260. In some embodiments, the through-silicon-vias 220 are formed after the silicon substrate 210 is attached onto the first die 230 but before the silicon substrate 210 and the first die 230 are attached onto the second die 260. In some other embodiments, the through-silicon-vias 220 can be formed in the silicon substrate 210 after the silicon substrate 210 are attached to the first die 230 and second die 260.

Figure 3:
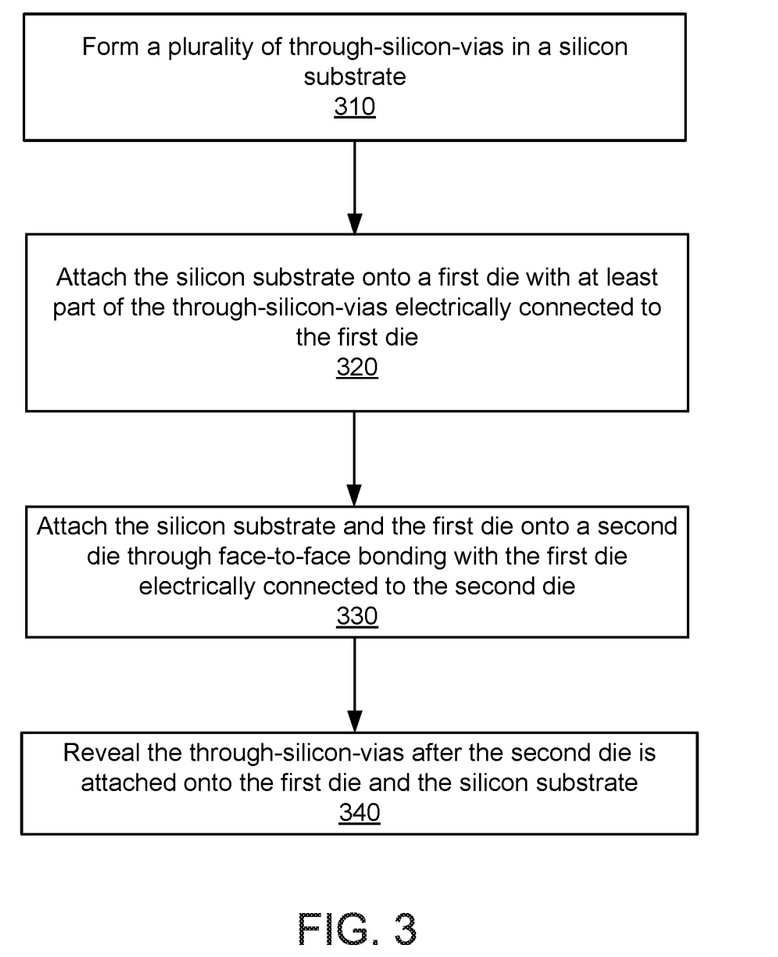
FIG. 3 is a flow chart illustrating a process for fabricating an assembly of stacked circuit dies, in accordance with an embodiment.

FIG. 3 is a flow chart illustrating a process for fabricating an assembly of stacked circuit dies, in accordance with an embodiment. The process may include different or additional steps than those described in conjunction with FIG. 3 in some embodiments or perform steps in different orders than the order described in conjunction with FIG. 3.

A plurality of through-silicon-vias are formed 310 in a silicon substrate. In some embodiments, the through-silicon-vias are formed at an edge of the silicon substrate.

The silicon substrate is attached onto a first die, e.g., through oxide-oxide bonding. The oxide-oxide bonding can be formed through plasma treatment, compression, and annealing. At least part of the through-silicon-vias are electrically connected to the first die. The silicon substrate and the first die are attached 330 onto a second die through face-to-face bonding with the first die electrically connected to the second die. The silicon substrate can function as a carrier substrate during the attaching process.

The through-silicon-vias are revealed 340 after the second die is attached onto the first die and the silicon substrate. The through-silicon-vias can be revealed by thinning the silicon substrate through etching, polishing, or other approaches. The thinned silicon substrate has a thickness no more than the height of the through-silicon-vias so that electrically conductive pads of the through-silicon-vias is revealed. Electrical components can be attached onto the silicon substrate and electrically connected to the through-silicon-vias. Examples of the electrical components include micro LEDs and photodiodes. The first die and the second die can include circuits that control and drive operation of the electrical components. Because the through-silicon-vias are not formed in the first die or the second die, loss of active circuit areas on the first die and second die are eliminated.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A method for fabricating an assembly of stacked circuit dies, comprising:
    forming a plurality of through-silicon-vias in a silicon substrate;
    attaching the silicon substrate onto a first die with at least part of the through-silicon-vias electrically connected to the first die;
    attaching the silicon substrate and the first die onto a second die through face-to-face bonding with the first die electrically connected to the second die; and
    revealing the through-silicon-vias after the second die is attached onto the first die and the silicon substrate,
    wherein the silicon substrate is configured to function as a carrier substrate before the revealing.

2. The method of claim 1, wherein a number of the through-silicon-vias is in a range from 10,000 to 500,000.

3. The method of claim 1, wherein the through-silicon-vias has a pitch in a range from 1 to 50 micrometers.

4. The method of claim 1, further comprising:
    attaching the silicon substrate attached with the first and second dies, on a printed circuit board with the second die electrically connected to the printed circuit board.

5. The method of claim 1, further comprising:
    attaching one or more electrical components onto the silicon substrate after the through-silicon-vias are revealed with the electrical components electrically connected to the first die through the through-silicon-vias.

6. The method of claim 5, wherein the one or more electrical components include an array of micro light emitting diodes or photodiodes.

7. The method of claim 5, wherein the first die comprises a driving circuit configured to provide driving current to the one or more electrical components.

8. The method of claim 5, wherein the second die comprises a digital circuit configured to convert digital signals into analog signals for operating the one or more electrical components.

9. The method of claim 5, wherein the silicon substrate comprises a metal element configured to diffuse heat generated from operation of the electrical components.

10. The method of claim 1, wherein the through-silicon-vias are formed at an edge of the silicon substrate.

* * * * *